(12) United States Patent
Hwang et al.

(10) Patent No.: US 6,404,253 B1
(45) Date of Patent: Jun. 11, 2002

(54) HIGH SPEED, LOW SETUP TIME VOLTAGE SENSING FLIP-FLOP

(75) Inventors: Yi-Ren Hwang, Tainan; Meng-Jer Wey, Hsinchu, both of (TW)

(73) Assignee: Faraday Technology Corp., Hsinchu (TW)

( * ) Notice: Subject to any disclaimer, the term of this patent is extended or adjusted under 35 U.S.C. 154(b) by 0 days.

(21) Appl. No.: 09/760,186

(22) Filed: Jan. 12, 2001

(51) Int. Cl.[7] ............................................... H03K 3/289
(52) U.S. Cl. ........................................ 327/203; 327/215
(58) Field of Search ................................. 327/202, 203, 327/210–213, 52–57, 215–218, 208, 212

(56) References Cited

U.S. PATENT DOCUMENTS

| | | | | |
|---|---|---|---|---|
| 5,469,079 A | * | 11/1995 | Mahant-Shetti et al. | 327/203 |
| 5,844,437 A | * | 12/1998 | Asazawa et al. | 327/202 |
| 5,892,382 A | * | 4/1999 | Ueda et al. | 327/202 |
| 5,945,858 A | * | 8/1999 | Sato | 327/202 |
| 5,986,490 A | * | 11/1999 | Hwang et al. | 327/202 |

* cited by examiner

Primary Examiner—Toan Tran
(74) Attorney, Agent, or Firm—J.C. Patents

(57) ABSTRACT

The high-speed, low setup time, voltage-sensing flip-flop of an embodiment of the present invention comprises a master stage and a slave stage. The master stage has a data input and a clock input. The slave stage receives two signal lines from the master stage. When the clock input is low, the two input lines to the slave stage are pulled high. This turns on two transistors and precharges the inputs to the slave stage. When the clock makes a high transition, the pullup transistors in the master stage are turned off which decouples the inputs of the slave stage from the output of the master stage. At this time, if the data input is high, the A input to the slave stage is discharged. If the data input is low, the B input to the slave stage is discharged. After the two inputs to the slave stage are decoupled from the master stage, any change in the data input signal causes the inputs to the slave stage to float low since the two lines are not pulled high or low. In this way, the inputs to the slave stage are precharged and discharged on every clock cycle. This precharging results in a nearly zero setup time.

1 Claim, 2 Drawing Sheets

HIGH SPEED, LOW SETUP TIME VOLTAGE SENSING FLIP-FLOP

BACKGROUND OF THE INVENTION

1. Field of Invention

The present invention relates to a flip-flop, and more particularly, to a high speed, low setup time voltage sensing flip-flop.

2. Description of Related Art

Timing requirements for digital systems increase as operating frequencies increase. As the integration or number of components increases as well as the speed at which they operate increase in circuits, any unnecessary delays must be eliminated.

Traditional flip-flops typically have relatively long clock-to-output (clk-to-Q) delays. The clk-to-Q delay is the time required for the data output to appear on the Q output, once the clock pulse input makes a transition to active. Besides the clk-to-Q delay, another timing concern is the setup time.

Refer to FIG. 1, which shows a circuit diagram of a conventional flip-flop. The flip-flop has a very large clk-to-Q delay (four inverter plus two transmission gates delay). The conventional flip-flop as shown in FIG. 1 also suffers from a large setup time (2 inverters plus 1 transmission gate delay).

SUMMARY OF THE INVENTION

In order to overcome the shortcomings and disadvantages of the conventional flip-flop, the invention provides a high-speed, low setup time, voltage-sensing flip-flop.

Refering to FIG. 2, which shows a circuit diagram of a high-speed, low setup time, voltage-sensing flip-flop of an embodiment of the present invention.

The high-speed, low setup time, voltage-sensing flip-flop of an embodiment of the present invention comprises a master stage and a slave stage. The master stage has a data input and a clock input. The slave stage receives two signal lines from the master stage. When the clock input is low, the two input lines to the slave stage are pulled high. This turns on transistors 190 and 200 and precharges the inputs to the slave stage.

When the clock goes high, the pullup transistors in the master stage are turned off which decouples the inputs of the slave stage from the output of the master stage. At this time, if IN is high, the A input to the slave stage is discharged. If IN is low, the B input to the slave stage is discharged. After the two inputs to the slave stage are decoupled from the master stage, any change in the IN signal result in the inputs to the slave stage to float low since the two lines are not pulled high or low. In this way, the inputs to the slave stage are precharged and discharged on every clock cycle. This precharging results in a nearly zero setup time.

Refering in particular to the slave stage in FIG. 2. Since the outputs Q and QB of the slave stage have symmetrical pullup and pulldown circuits, there is no delay difference between the two output signals. This can be compared with the Q output and the QB output of FIG. 1 of the conventional flip-flop. Note that the Q output must pass through an additional inverter. This causes a delay between the two outputs and results in an inferior design. This is an advantage of the present invention over the conventional design.

When both inputs A and B to the slave stage are high, transistors 190 and 200 are on and transistors 130 and 160 are off. This permits transistors 140 and 150 to maintain their logic levels which keeps the Q and QB outputs stable.

When the clock input transitions to a high, the edge of the clock signal causes either the A input or the B input to discharge depending upon the level of the data input IN. The construction of the master stage allows only one of the inputs A or B to discharge each clock transition. Therefore, the Q output and the QB output are complementary logic levels. In the above case, if the IN input is high, the A input is discharged, turning transistor 130 on, and causing the Q output to be pulled up to a logic high and the QB output is a logic low. If the IN input is low, the B input is discharged, turning transistor 160 on, and causing the QB output to be pulled up to a logic high and the Q output to be a logic low.

Since the inputs to the slave stage are precharged during every clock cycle, the voltage-sensing flip-flop of the present invention is very high-speed and has an extremely low setup time. In fact, due to the design of the master and slave stages, the setup time actually approaches zero.

In contrast, the conventional flip-flop has a very large clk-to-Q delay composed of delay from four inverters plus two transmission gates. In addition, the conventional flip-flop also suffers from a large setup time caused by a delay from two inverters plus a transmission gate. Furthermore, the conventional flip-flop has a delay between the Q output and the QB output since the Q output must pass through an additional inverter in order to make the Q output and QB output complementary.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
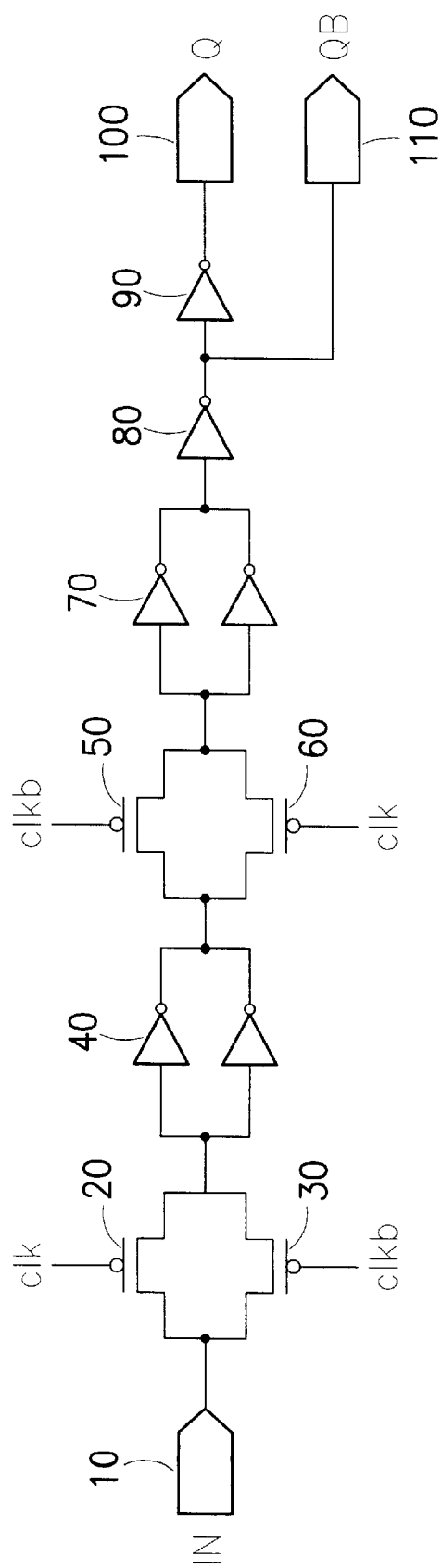
FIG. 1 shows a circuit diagram for a conventional flip-flop.

Reference will now be made in detail to the preferred embodiments of the present invention, an example of which is illustrated in the accompanying drawing. Wherever possible, the same reference numbers are used in the drawings and description to refer to the same or like parts.

Figure 2:
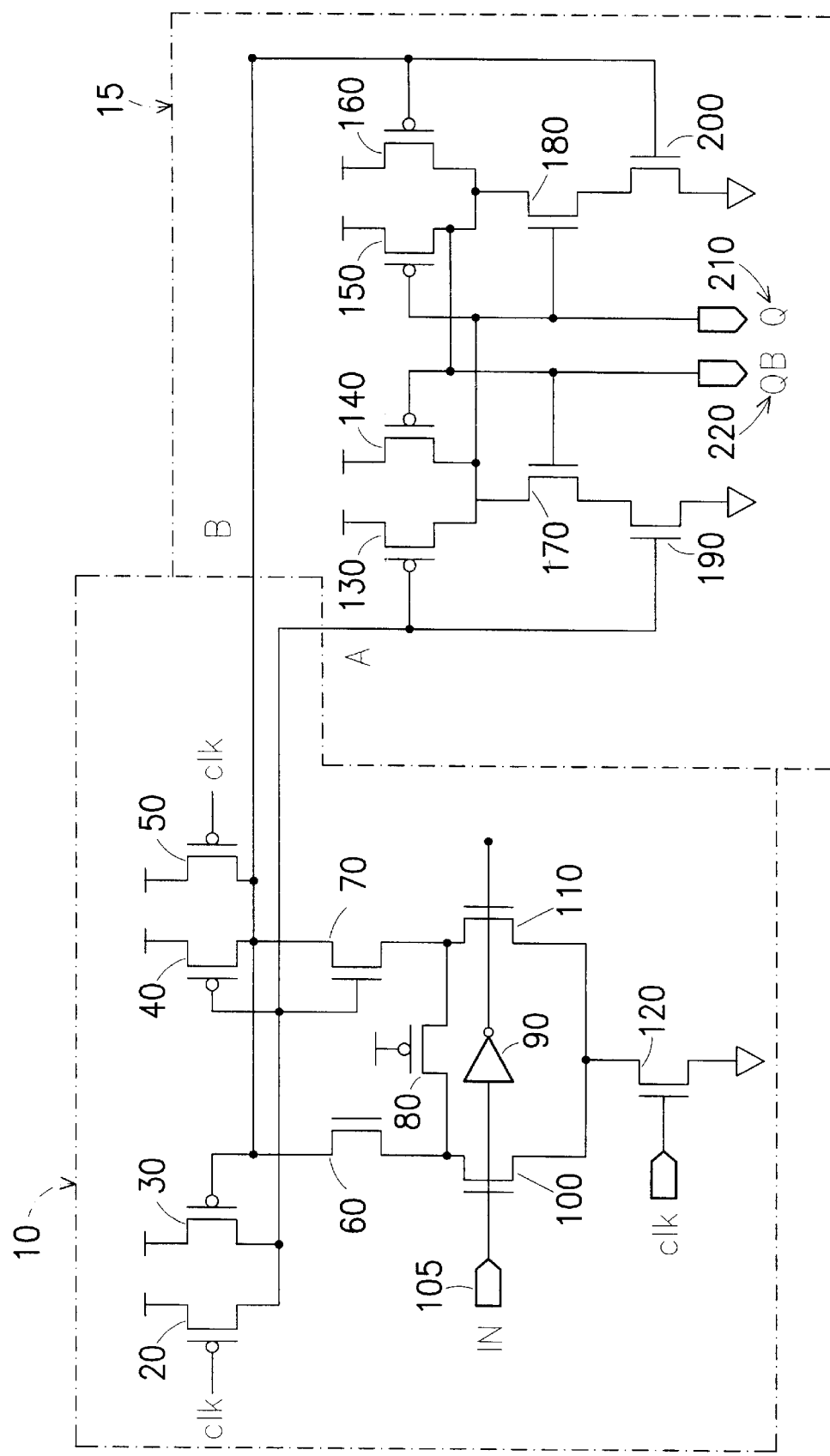
FIG. 2 shows a circuit diagram of a high-speed, low setup time, voltage-sensing flip-flop of an embodiment of the present invention.
Figure 1:
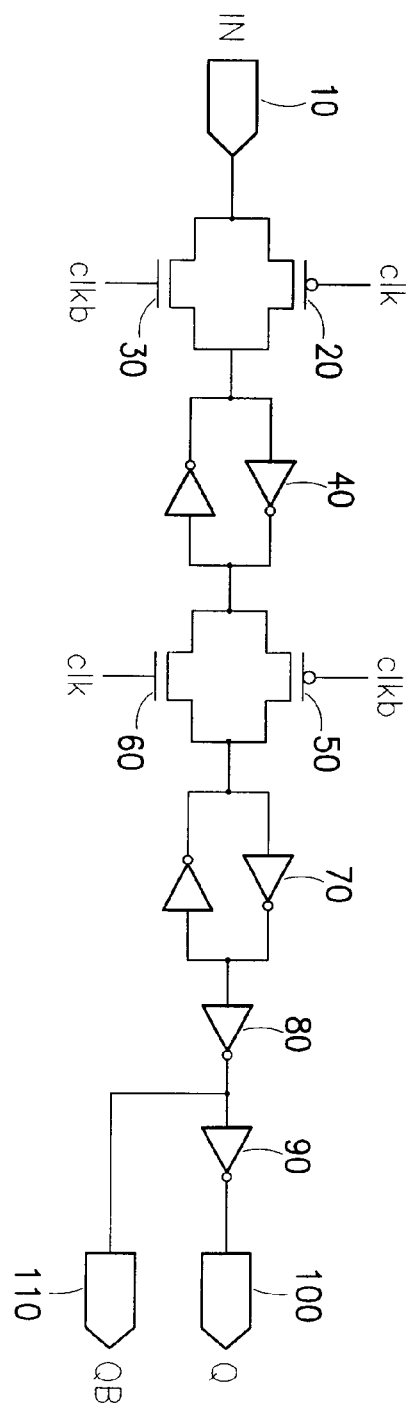
Figure 2:
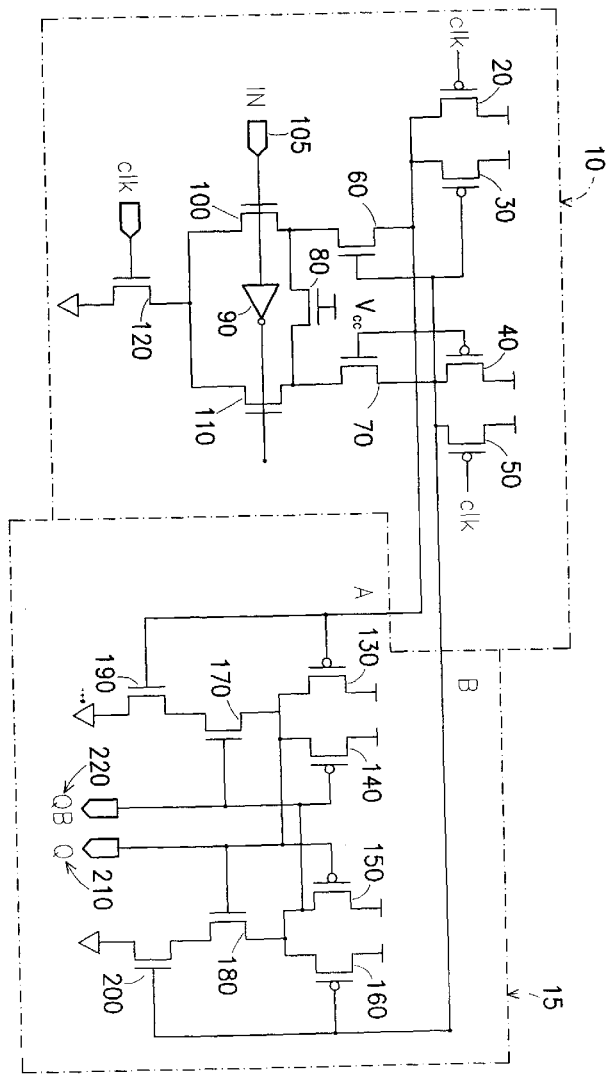

Refering to FIG. 2, which shows a circuit diagram of a high-speed, low setup time, voltage-sensing flip-flop of an embodiment of the present invention.

The high-speed, low setup time, voltage-sensing flip-flop of an embodiment of the present invention comprises a master stage 10 and a slave stage 15. The master stage 10 has a data input IN 105 and a clock input CLK. The slave stage 15 receives two signal lines, A and B, from the master stage 10. When the clock input CLK is low, the two input lines, A and B, to the slave stage 15 are pulled high. This turns on transistors 190 and 200 and precharges the inputs A and B to the slave stage 15.

Transistor 80 in the master stage bridges the data input transistors 100 and 110. This transistor 80 works as an equalizer which equalizes the level between the IN input 100 signal pullup/pulldown path and the INB 110 signal pullup/pulldown path.

When the clock CLK makes a high transition, the pullup transistors, 20 and 50, in the master stage 10 are turned off which decouples the inputs A and B of the slave stage 15 from the output of the master stage 10. At this time, if IN 105 is high, the A input to the slave stage 15 is discharged. If IN 105 is low, the B input to the slave stage 15 is discharged. After the two inputs, A and B, to the slave stage 15 are decoupled from the master stage 10, any change in the IN signal 105 results in the inputs to the slave stage 15 to float low since the two lines are not pulled high or low. In this way, the inputs, A and B, to the slave stage 15 are precharged and discharged on every CLK clock cycle. This precharging results in a nearly zero setup time.

Since the master stage acts as a voltage-sensing amplifier, during sensing there is only a short unsteady state time. However, after the steady state has been achieved, any changes in the data input IN 105 or INB 110 will not have any effect on the two inputs, A and B, to the slave stage. The higher voltage level on data input IN 105 or data input INB 110 will determine the state of A and B once steady state is reached.

Referring in particular to the slave stage 15 in FIG. 2. Since the outputs Q 210 and QB 220 of the slave stage 15 have symmetrical pullup and pulldown circuits, there is no delay difference between the two output signals Q 210 and QB 220. This can be compared with the Q output 100 and the QB output 110 of FIG. 1 of the conventional flip-flop. Note that the Q output 100 of the conventional flip-flop must pass through an additional inverter 90. This causes a delay between the two outputs, Q 100 and QB 110 and results in an inferior design. This nonsymmetrical output caused by the delay between the two outputs Q 100 and QB 110 is a disadvantage of the conventional flip-flop and the elimination of the non-symmetry is an advantage of the present invention over the conventional design.

Referring to FIG. 2 again. When both inputs A and B to the slave stage 15 are high, transistors 190 and 200 are on and transistors 130 and 160 are off. This permits transistors 140 and 150 to maintain their logic levels which keeps the Q 210 and QB 220 outputs stable.

When the clock input CLK transitions to a high, the edge of the clock signal CLK causes either the A input or the B input to discharge depending upon the level of the data input IN 105. The construction of the master stage 10 allows only one of the inputs A or B to discharge each CLK clock transition. Therefore, the Q output 210 and the QB output 220 are complementary logic levels. In the above case, if the IN input 105 is high, the A input is discharged, turning transistor 130 on, and causing the Q output 210 to be pulled up to a logic high and the QB output 220 to be a logic low. If the IN input 105 is low, the B input is discharged, turning transistor 160 on, and causing the QB output 220 to be pulled up to a logic high and the Q output 220 to be a logic low.

Since the inputs, A and B, to the slave stage 15 are precharged during every clock cycle CLK, the voltage-sensing flip-flop of the present invention is very high-speed and has an extremely low setup time. In fact, due to the design of the master 10 and slave 15 stages, the setup time actually approaches zero.

In contrast, the conventional flip-flop has a very large clk-to-Q delay composed of delay from four inverters plus two transmission gates. In addition, the conventional flip-flop also suffers from a large setup time caused by a delay from two inverters plus a transmission gate. Furthermore, the conventional flip-flop has a delay between the Q output and the QB output since the Q output must pass through an additional inverter in order to make the Q output and QB output complementary.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

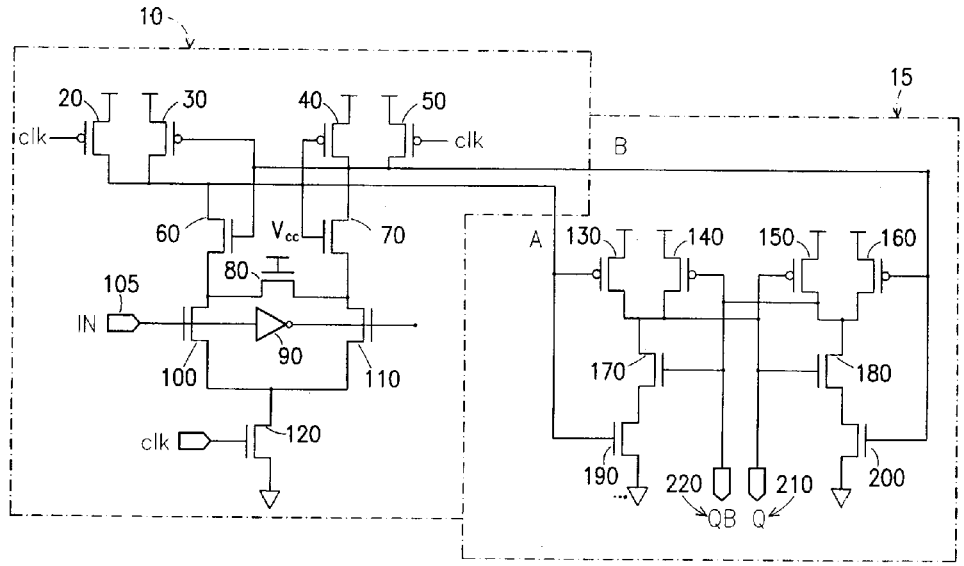

What is claimed is:

1. A high speed, low setup time, voltage-sensing flip-flop comprising:

a master stage circuit for receiving a data input and a clock, and providing a corresponding first signal and a second signal, wherein the first signal and the second signal are complementary to each other;

a slave stage circuit for receiving the first signal and the second signal, so as to generate an output signal Q and an output signal QB that is complementary to the output signal Q, wherein the slave stage circuit includes a first route circuit to export the output signal Q and a second route circuit to export the output signal QB, wherein the first route circuit and the second route circuit are mirror symmetric to each other, wherein the first route circuit includes:
      a first PMOS transistor, of which a source electrode is connected to a system power, a gate electrode receives the first signal;
      a second PMOS transistor, of which a source electrode is connected to the system power, a gate electrode is connected to a terminal for exporting the output signal Q, and a drain electrode is connected to a drain electrode of the first PMOS transistor;
      a first NMOS transistor, of which a source electrode is connected to the drain electrode of the first PMOS transistor, and a gate electrode is connected to the terminal for exporting the output signal Q; and
      a second NMOS transistor, of which a drain electrode is connected to a drain electrode of the first NMOS transistor, a gate electrode is connected to the gate electrode of the first PMOS transistor for receiving the first signal, and a source electrode is connected to a ground, wherein the second rout circuit includes:
      a three PMOS transistor, of which a source electrode is connected to the system power, a gate electrode receives the second signal;
      a fourth PMOS transistor, of which a source electrode is connected to the system power, a gate electrode is connected to a terminal for exporting the output signal QB and to the drain electrode of the first PMOS transistor, and a drain electrode is connected to a drain electrode of the third PMOS transistor and the gate electrode of the second PMOS transistor;
      a third NMOS transistor, of which a source electrode is connected to the drain electrode of the third PMOS transistor, an a gate electrode is connected to the terminal for exporting the output signal QB; and
      a fourth NMOS transistor, of which a drain electrode is connected to a drain electrode of the third NMOS transistor, a gate electrode is connected to the gate electrode of the third PMOS transistor for receiving the second signal, and a source electrode is connected to the ground.

* * * * *

UNITED STATES PATENT AND TRADEMARK OFFICE
CERTIFICATE OF CORRECTION

PATENT NO.     : 6,404,253 B1
DATED          : June 11, 2002
INVENTOR(S)    : Yi-Ren Hwang et al.

It is certified that error appears in the above-identified patent and that said Letters Patent is hereby corrected as shown below:

The title page showing an illustrated figure, should be deleted and substituted therefor the attached title page.

Delete drawing sheets 1 & 2, and substitute therefor the attached drawing sheets 1 & 2.

Signed and Sealed this

Twenty-sixth Day of August, 2003

JAMES E. ROGAN
*Director of the United States Patent and Trademark Office*

(12) United States Patent
Hwang et al.

(10) Patent No.: US 6,404,253 B1
(45) Date of Patent: Jun. 11, 2002

(54) HIGH SPEED, LOW SETUP TIME VOLTAGE SENSING FLIP-FLOP

(75) Inventors: Yi-Ren Hwang, Tainan; Meng-Jer Wey, Hsinchu, both of (TW)

(73) Assignee: Faraday Technology Corp., Hsinchu (TW)

( * ) Notice: Subject to any disclaimer, the term of this patent is extended or adjusted under 35 U.S.C. 154(b) by 0 days.

(21) Appl. No.: 09/760,186

(22) Filed: Jan. 12, 2001

(51) Int. Cl.$^7$ ................................................ H03K 3/289
(52) U.S. Cl. ...................................... 327/203; 327/215
(58) Field of Search ................................ 327/202, 203, 327/210–213, 52–57, 215–218, 208, 212

(56) References Cited

U.S. PATENT DOCUMENTS

| | | | |
|---|---|---|---|
| 5,469,079 A | * 11/1995 | Mahant-Shetti et al. | .... 327/203 |
| 5,844,437 A | * 12/1998 | Asazawa et al. | ............ 327/202 |
| 5,892,382 A | * 4/1999 | Ueda et al. | .................. 327/202 |
| 5,945,858 A | * 8/1999 | Sato | ............................ 327/202 |
| 5,986,490 A | * 11/1999 | Hwang et al. | .............. 327/202 |

* cited by examiner

*Primary Examiner*—Toan Tran
(74) *Attorney, Agent, or Firm*—J.C. Patents

(57) ABSTRACT

The high-speed, low setup time, voltage-sensing flip-flop of an embodiment of the present invention comprises a master stage and a slave stage. The master stage has a data input and a clock input. The slave stage receives two signal lines from the master stage. When the clock input is low, the two input lines to the slave stage are pulled high. This turns on two transistors and precharges the inputs to the slave stage. When the clock makes a high transition, the pullup transistors in the master stage are turned off which decouples the inputs of the slave stage from the output of the master stage. At this time, if the data input is high, the A input to the slave stage is discharged. If the data input is low, the B input to the slave stage is discharged. After the two inputs to the slave stage are decoupled from the master stage, any change in the data input signal causes the inputs to the slave stage to float low since the two lines are not pulled high or low. In this way, the inputs to the slave stage are precharged and discharged on every clock cycle. This precharging results in a nearly zero setup time.

1 Claim, 2 Drawing Sheets